United States Patent [19]

Abe et al.

[11] Patent Number: 4,962,456

[45] Date of Patent: Oct. 9, 1990

[54] DIAGNOSIS SYSTEM FOR A MOTOR VEHICLE

[75] Inventors: Kunihiro Abe; Tomoya Kobayashi, both of Tokyo, Japan

[73] Assignee: Fuji Jukogyo Kabushiki Kaisha, Tokyo, Japan

[21] Appl. No.: 278,742

[22] Filed: Nov. 30, 1988

[30] Foreign Application Priority Data

Dec. 11, 1987 [JP] Japan .................. 62-313433

[51] Int. Cl.⁵ ............... G01M 15/00; F02D 41/26; F02P 17/00
[52] U.S. Cl. ............... 364/431.01; 73/117.2; 364/424.03; 364/551.01
[58] Field of Search ............ 364/431.01, 431.11, 364/551.01, 424.03, 424.04; 73/116, 117.3, 119 R, 117.2; 371/20

[56] References Cited

U.S. PATENT DOCUMENTS

| | | | |
|---|---|---|---|
| 4,108,362 | 8/1978 | Trussel et al. | 73/116 |
| 4,567,756 | 2/1986 | Colborn | 73/118.1 |
| 4,694,408 | 9/1987 | Zaleski | 364/431.01 |
| 4,748,843 | 6/1988 | Schäfer et al. | 73/118.1 |
| 4,757,463 | 7/1988 | Ballou et al. | 364/431.01 |

FOREIGN PATENT DOCUMENTS

58-12848  1/1983  Japan .............. 364/431.01

Primary Examiner—Felix D. Gruber
Attorney, Agent, or Firm—Martin A. Farber

[57] ABSTRACT

An electronic control system for controlling an automotive engine is mounted on a motor vehicle. A memory in a computer stores a plurality of data formats and signaling speeds. One of the data formats and signaling speeds is selected, and an answer demand signal dependent on a selected data format and signaling speed is fed to the electronic control system. In response to an answer from the electronic control system, a diagnosis is performed.

5 Claims, 7 Drawing Sheets

| $a_1$ | $a_2$ | $a_3$ | $a_4$ |
|---|---|---|---|
| HIGH-ORDER ADDRESS | LOW-ORDER ADDRESS | OUTPUT DATA | SUM CHECK |

| $b_1$ | $b_2$ | $b_3$ | $b_4$ | ... | $b_{n-1}$ | $b_n$ |
|---|---|---|---|---|---|---|
| HIGH-ORDER ADDRESS | LOW-ORDER ADDRESS | BYTE COUNT | OUTPUT DATA | | OUTPUT DATA | SUM CHECK |

| $c_1$ | $c_2$ | $c_3$ | ... | $c_{n-1}$ | $c_n$ |
|---|---|---|---|---|---|
| HIGH-ORDER ADDRESS | LOW-ORDER ADDRESS | OUTPUT DATA | | OUTPUT DATA | BLANK |

DIAGNOSIS SYSTEM FOR A MOTOR VEHICLE

BACKGROUND OF THE INVENTION

The present invention relates to a diagnosis system for a motor vehicle and more particularly to a system where correct data formats and signaling speeds of various types of a control system for the vehicle are provided and a format and speed for a vehicle to be diagnosed is automatically selected.

Recently, a motor vehicle has been equipped with an electronic control system for controlling various components of an engine, such as fuel injectors, thereby improving driveability, exhaust gas emission, fuel consumption, and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out troubles. Accordingly, a trouble diagnosis device for easily checking the electronic control system should be provided as equipment in an auto shop.

Japanese Patent Application Laid-Open 58-12848 discloses a diagnosis system in which an exclusive checking device is provided for measuring pulse duration of fuel injection and engine speed, and for checking whether idling speed is normal. The checking device is provided for diagnosing only designated specific types of motor vehicles.

However, the data format and the signaling speed of the electronic control systems differ with different types of electronic control systems. In order to diagnose various types of vehicles, it is necessary to equip several types of checking devices corresponding to the respective types of electronic control systems, which is inconvenient in management and uneconomical.

Further, a diagnosis system which stores a plurality of data formats and deals with a plurality of signaling speeds for diagnosing various types of electronic control systems has been proposed. In such a system, a code representing a type of an electronic control system equipped in a vehicle to be diagnosed must be input in the diagnosis system for selecting the data format and the signaling speed. However, it is troublesome work to confirm the corresponding code and to input the code consisting of a plurality of figures. If an erroneous code is input, the correct data format and signaling speed are not selected, so that a proper diagnosis can not be performed.

SUMMARY OF THE INVENTION

An object of the present invention is to provide a diagnosis system which has excellent operability whereby diagnosis may be easily performed without inputting a code for a data format and signaling speed by a diagnostician.

The other objects and features of this invention will become understood from the following description with reference to the accompanying drawings.

DETAILED DESCRIPTION OF THE PREFERRED EMBODIMENT

Figure 1:
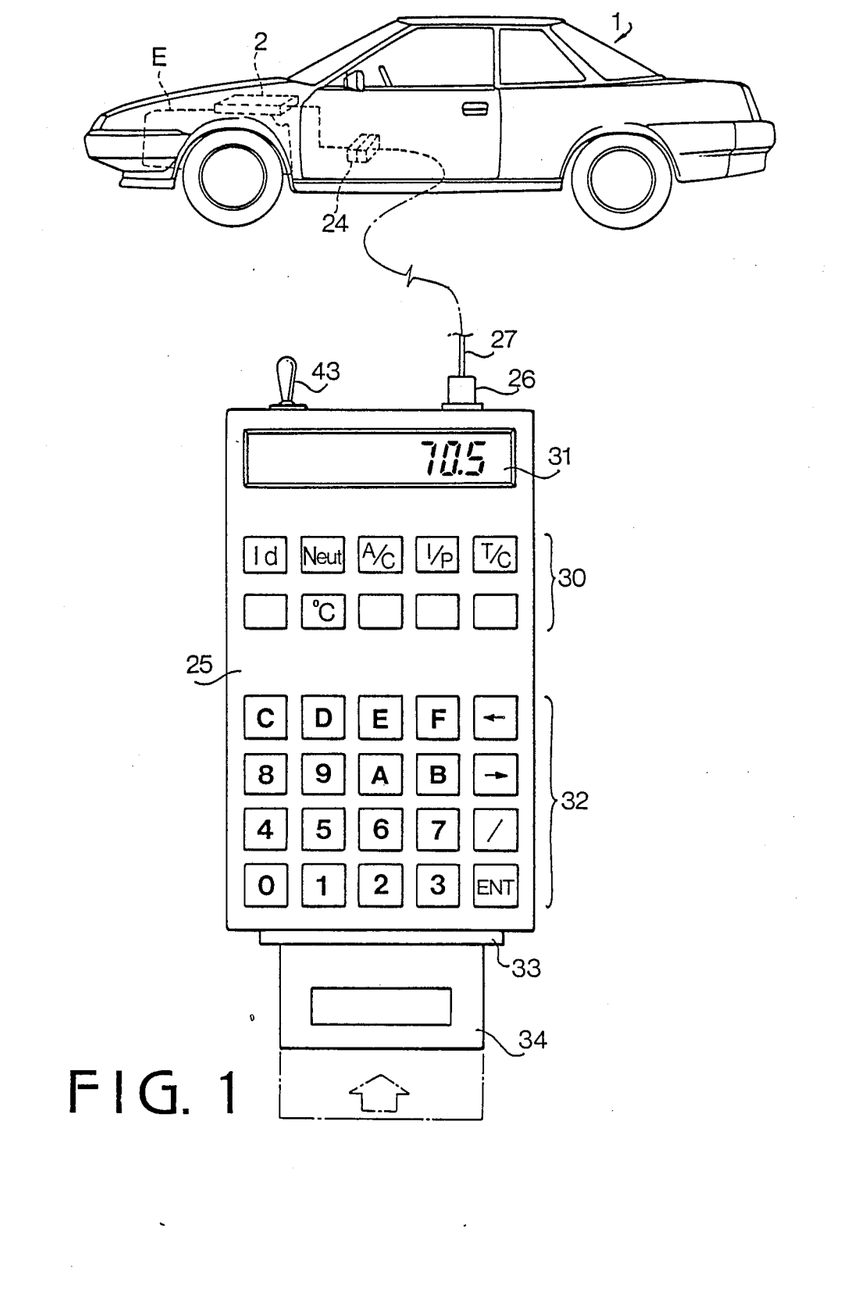
FIG. 1 is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer has a connector 26, to which the connector 24 of the system 2 is connected through an adapter harness 27.

The diagnosis device 25 has a power switch 43, a liquid crystal display 31, an indicator section 30 consisting of a plurality of LED indicators and a keyboard 32. A connector 33 is provided for connecting a detachable memory cartridge 34.

Figure 2A:
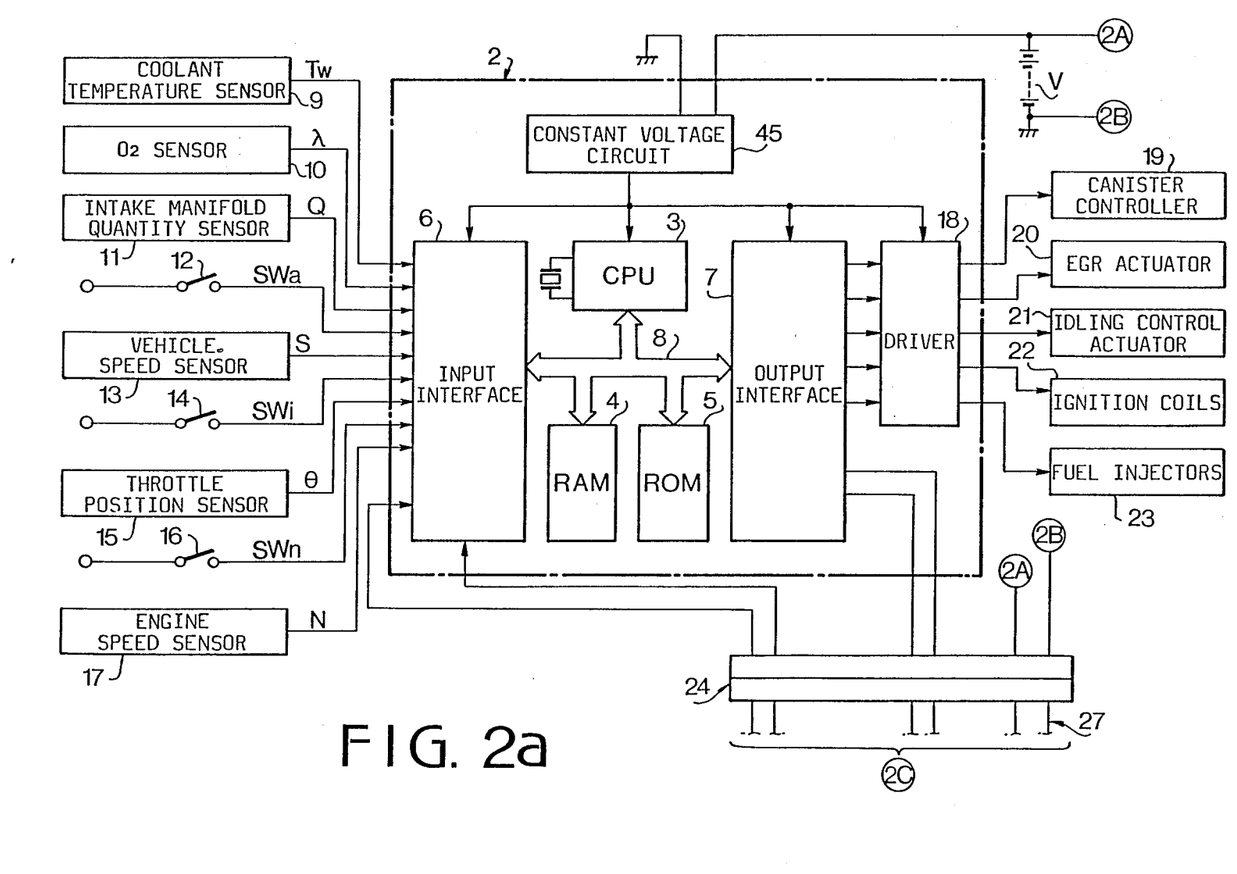
FIGS. 2a and 2b are block diagrams showing the construction of the diagnostic system.
Figure 2B:
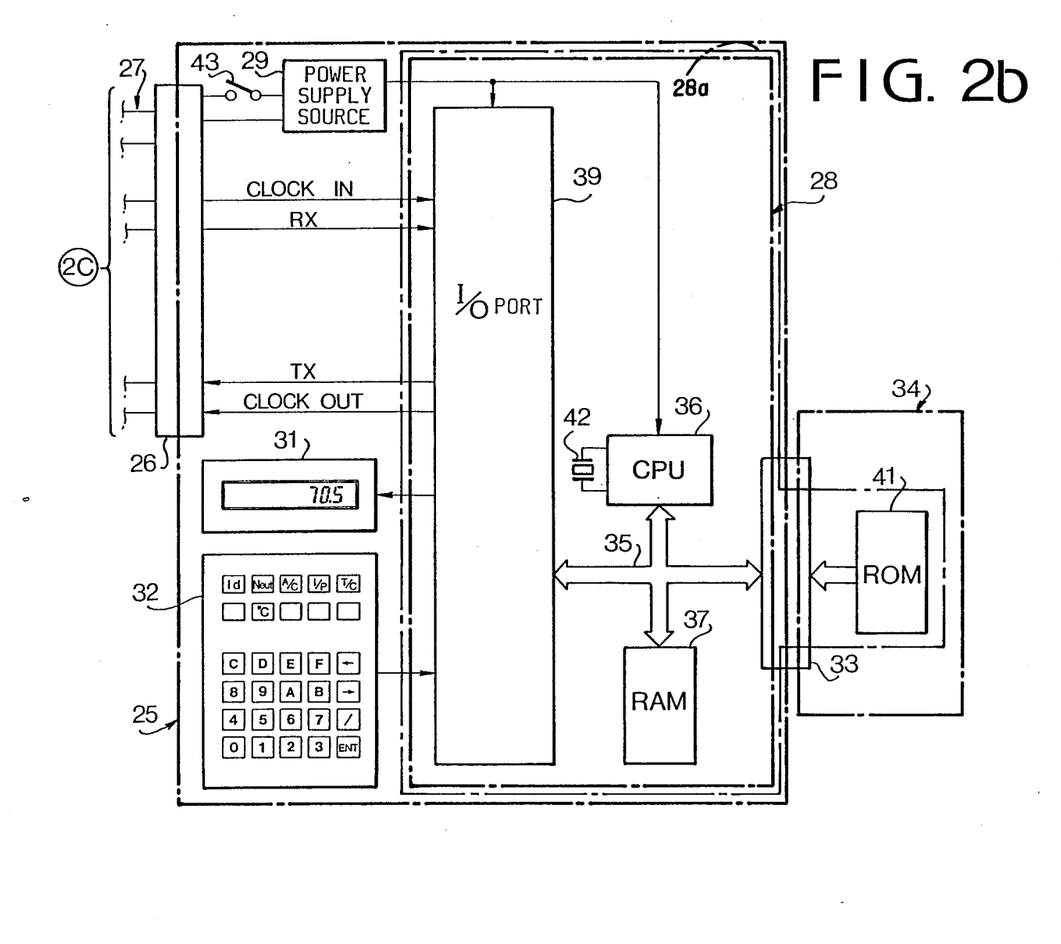

Referring to FIGS. 2a and 2b, the electronic control system 2 comprises a central processor unit (CPU) 3, a random access memory (RAM) 4, a read only memory (ROM) 5, an input interface 6 and an output interface 7. The CPU 3, RAM 4, ROM 5, input and output interfaces 6 and 7 are connected to each other through a bus line 8. Programs and data for controlling the engine are stored in the ROM 5. Power is supplied to the CPU 3, input and output interfaces 6 and 7, and driver 18 from a source V through a constant voltage circuit 45

The input interface 6 is applied with a coolant temperature signal Tw from a coolant temperature sensor 9, an air-fuel ratio feedback signal $\lambda$ from an $O_2$ sensor 10, an intake-air quantity signal Q from an intake-air quantity sensor 11, an air conditioner operating signal SWa from an air conditioner switch 12, a vehicle speed signal S from a vehicle speed sensor 13, an idling signal SWi from an idle switch 14, a throttle valve opening degree signal $\theta$ from a throttle position sensor 15, a neutral positioning signal SWn from a neutral switch 16 in a transmission, and an engine speed signal N from an engine speed sensor 17. These signals are stored in the RAM 4 after data processing in accordance with the program stored in the ROM 5. The CPU 3 produces respective control signals, which are applied to the driver 18 through the output interface 7. The driver 18 produces signals for controlling a canister controller 19 of a fuel-vapor emission control system, an EGR (exhaust gas recirculation system) actuator 20, an idling control actuator 21, ignition coils 22, and fuel injectors 23.

The diagnosis device 25 has a control unit 28 and a power supply source 29. The control unit 28 comprises a CPU 36, a RAM 37, an input/output (I/O) port 39. These elements are connected to each other through a bus line 35. A clock pulse generator 42 is provided for generating synchronizing pulses. A ROM 41 provided in the memory cartridge 34 is connected to the bus line 35 through the connector 33. The ROM 41 stores a plurality of programs for diagnosing various troubles of the control system 2. Inputs of the I/O port 39 are connected to the output interface 7 of the control system 2 through connectors 24 and 26 and harness 27 so as to receive output signals of the sensors and switches 9 to 17. Inputs of the I/O port 39 are connected to the keyboard 32 for being applied with a mode select signal dependent on the operation of the keyboard, and to the output interface 7. Outputs of the port 39 are connected to the input interface 6 and the display 31. The power source 29 for supplying the power to the CPU 36 and I/O port 39 is connected to the source V through the power switch 43.

Figure 3:
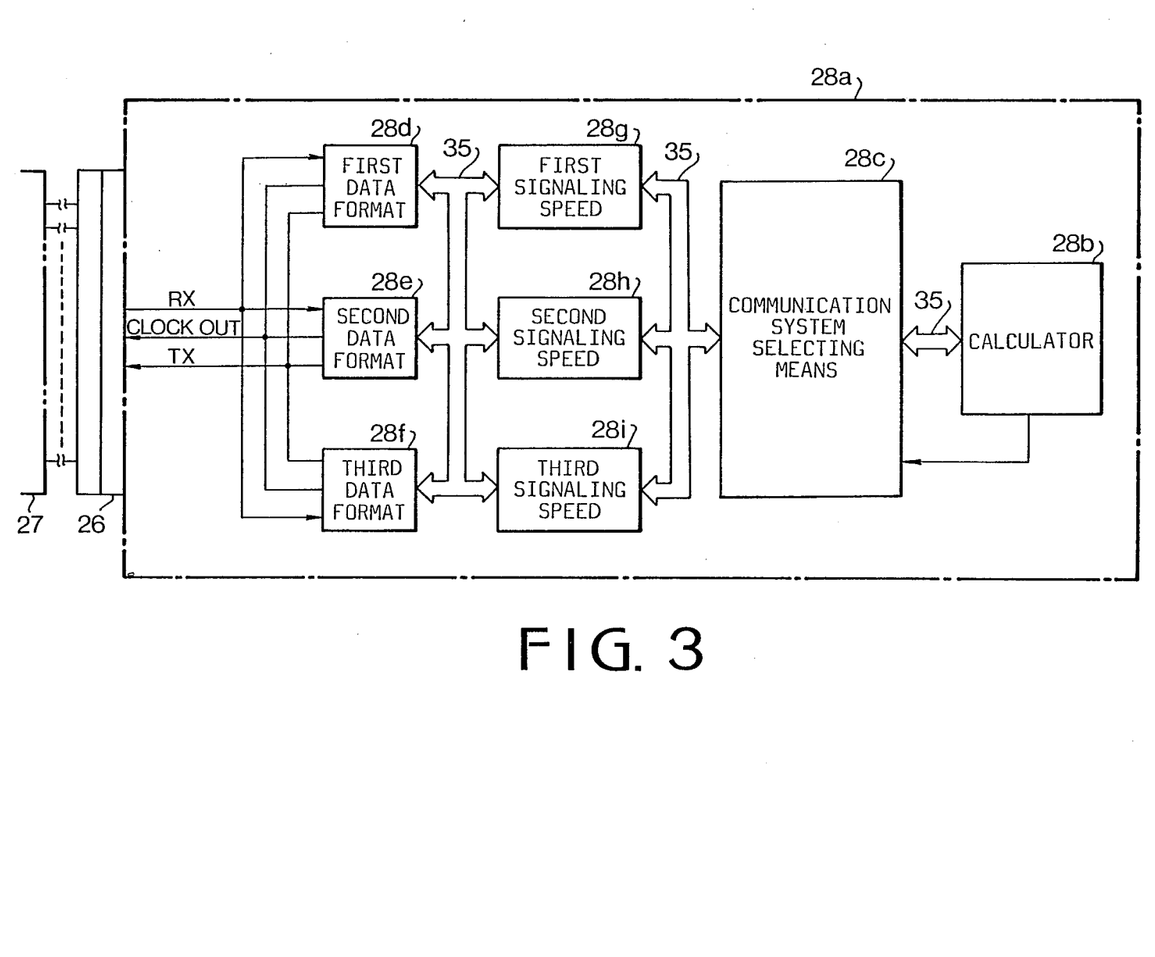
FIG. 3 is a conceptional block diagram illustrating the function of a main part of the system.

Referring to FIG. 3, illustrating the function for selecting one of the communication systems, a communication control section 28a is provided in the control unit 28 and the ROM 41. The section 28a has a calculator 28b, and a communication system selecting means 28c. The ROM 41 stores a program for providing and selecting one of data formats comprising first, second and third data formats 28d, 28e and 28f and one of signaling speeds comprising first, second and third signaling speeds 28g, 28h and 28i. Lines 35 are to show signal flow paths for enabling the selection.

The calculator 28b makes calculations dependent on the signals from the control system 2 and produces signals so as to indicate the calculated data on the display 31.

Figure 4A:
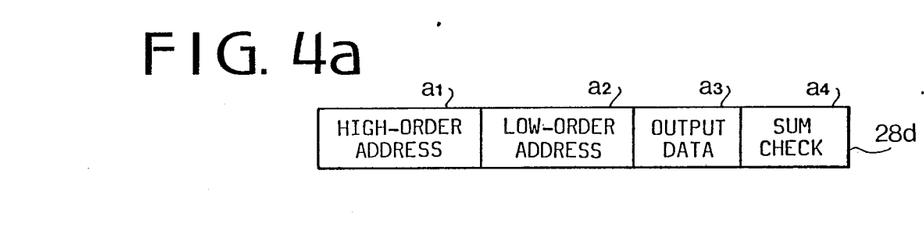
FIGS. 4a to 4c show various data formats.
Figures 4B, 4C:
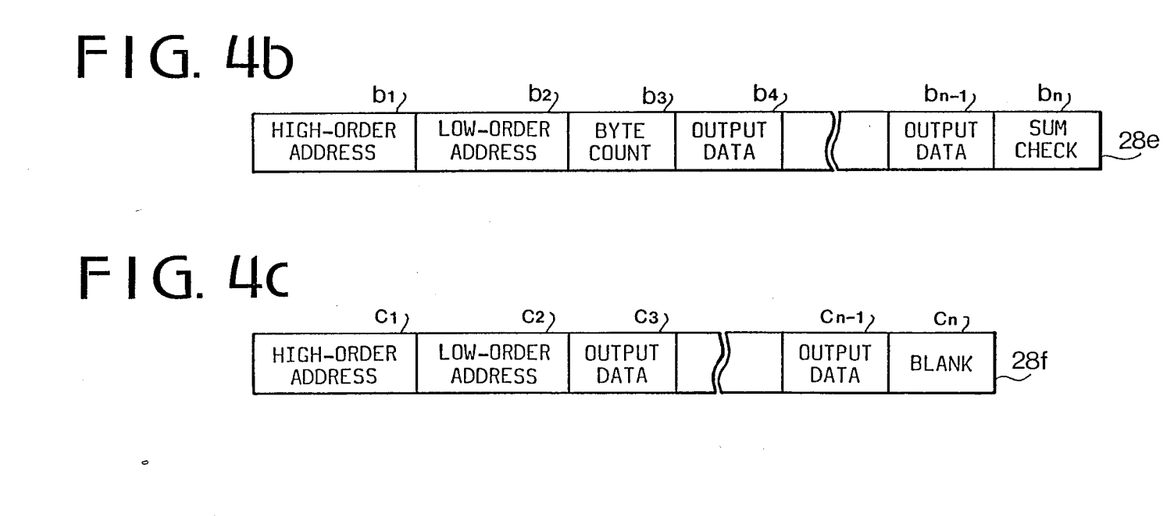

The first, second and third data formats 28d, 28e and 28f are formed as shown in FIGS. 4a, 4b and 4c, respectively. The first data format 28d comprises data $a_1$ for a high-order address, data $a_2$ for a low-order address, output data $a_3$ and sum check data $a_4$ for checking the sumation of transmitted data.

The second data format 28e comprises a data $b_1$ for a high-order address, data $b_2$ for a low-order address, a plurality of output data $b_4$ to $b_{n-1}$, byte counter $b_3$ for storing a total number of bytes comprising output data and sum check data $b_n$.

The third data format 28f, which is a so-called non-procedure protocol system, comprises data $c_1$ for a high-order address, data $c_2$ for a low-order address a plurality of output data and blank data $c_n$.

Each of signaling speeds 28g, 28h and 28i has a different signaling speed, for example, 300 baud, 600 baud and 1200 baud.

The number of data formats and signaling speeds may be increased so as to be adapted to various types of control systems of the vehicle.

Before performing the diagnosis program, the control system 2 is connected to the diagnosis device 25 through the harness 27 and cartridge 34 which is attached to the diagnosis device 25.

The operation of the system is described hereinafter with reference to the flowcharts of FIGS. 5a and 5b. The engine is started, and the following diagnosis program is performed under the running condition of the engine.

Figure 5A:
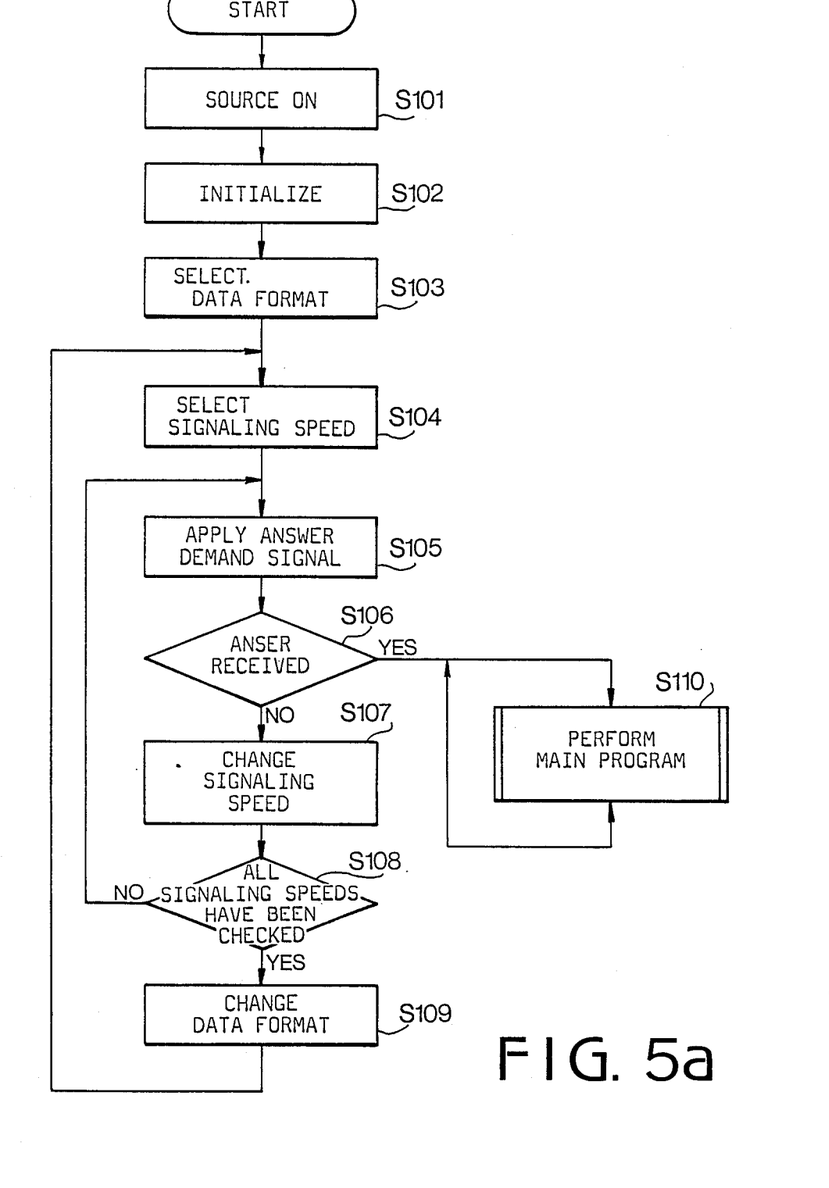
FIG. 5a is a flowchart showing an operation for selecting a format and a signaling speed.
Figure 5B:
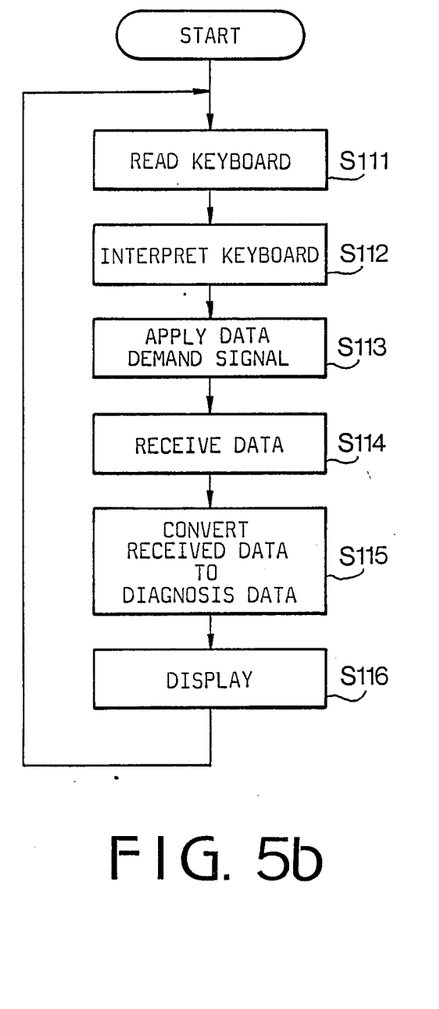
FIG. 5b is a flowchart showing a diagnosis operation of the system.

FIG. 5a shows an operation for detecting the data format and signaling speed of the control system 2. The power switch at a step S101. At a step S102, initialization of the control unit 28 is performed. At steps S103 and S104, one of the data formats 28d to 28f and one of the signaling speeds 28g to 28i are provided by the program. An answer demand signal TX representing on the selected format and signaling speed is applied to the control system 2 at a step S105. Step S106 determines whether an answer signal RX is generated from the control system 2 and applied to the unit 28. If the answer signal RX is applied, the preselected data format and the signaling speed are selected, and a main program, which is a diagnosing program, is performed by the selected data format and signaling speed at a step S110.

When an answer signal is not generated, the program goes to a step S107 where another signaling speed is preselected. At a step S108, it is determined whether the number of times of change of the signaling speed has reached the number of the equipped signaling speeds, which is three in the present embodiment shown in FIG. 3. When the number of the selection is smaller than three, the program returns to the, step S105. If the answer signal is not obtained although the change of the signaling speed is performed the predetermined number of times, the program proceeds to a step S109 where the data format is changed. The program returns to the step S104 where a signaling speed is provided. The above-described program is repeated until a corresponding data format and a signaling speed are selected by checking whether the answer signal is applied to the unit 28 or not. After the corresponding data format and signaling speed are fixed, the main program which will be described hereinafter with reference to FIG. 5b, is carried out at the step S110.

A diagnostician operates the keyboard 32 to select a diagnosis mode, for example for monitoring a battery voltage or an injection pulse width. Thus, a mode code is stored in the RAM 37 in the unit 28.

At a step S111, the stored mode is read by the control unit 28 and at a step S112, the content of the mode is interpreted by the CPU 36. At a step S113, a data demand signal TX corresponding to the mode is applied to the system 2. At a step S114, a data signal RX representing a battery voltage or a fuel injection pulse width is applied to the unit 28 from the control system 2 through the selected data format and signaling speed. At a step S115, the received binary digit is converted into a decimal digit representing the battery voltage or pulse width. At a step S116, the battery voltage or the pulse width is displayed on the display 31. Thus, the diagnostician can diagnose the battery voltage or the fuel injection pulse width.

From the foregoing it will be understood that the correct data format and signaling speed corresponding to the type of the control system mounted on the vehicle can be automatically selected Accordingly, the diagnosis of the engine can be performed without inputting a identification code signal for a data format and signaling speed, so that the diagnosis can be easily performed without fail.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. In a system for diagnosing an automotive engine which is mounted on a motor vehicle and controlled by an electronic control system, the diagnosing system having diagnosis means including a diagnosis device powered by turning on a power switch and a cartridge detachably connected to the diagnosis device, connecting means for transmitting signals between the electronic control system and the diagnosis device, a keyboard provided in said diagnosis device for inputting a keyboard signal, and said diagnosis means being responsive to said keyboard signal for monitoring operating condition of the engine, the improvement in the diagnosis means comprising:

first storing means in the cartridge for storing programs to diagnose the engine;

second storing means in the diagnosis means for storing a plurality of data formats representing a plurality of transmitting patterns for transmitting data between the electronic control system and the diagnosis device;

third storing means in the diagnosis means for storing a plurality of signaling speeds representing a plurality of transmitting speeds for transmitting data between the electronic control system and the diagnosis device;

select means responsive solely to turning on the power switch for selecting one of said data formats and one of said signaling speeds; and demand means for sending an answer demand signal representing said selected data format and signaling speed to the electronic control system; and wherein said electronic control system has its own data format and signaling speed dependent on its type of electronic control system for the engine, and said electronic control system is arranged to provide an answer signal when said answer demand signal applied thereto corresponds to said own data format and signaling speed; and means responsive to said answer signal for performing a diagnosis dependent on a selected program selected from the first storing means.

2. The system according to claim 1 wherein the diagnosing device has indicators.

3. The diagnosing system as set forth in claim 1, wherein said select means is for selecting another one of said data formats and another one of said signaling speeds, respectively, when said answer signal is not provided by said electronic control system when said answer demand signal applied thereto does not correspond to said own data format and signaling speed of said electronic control system, and said demand means is for sending another answer demand signal representing said another one of said data formats and another one of said signaling speeds, respectively, to said electronic control system.

4. The diagnosing system as set forth in claim 1, wherein said keyboard selects the selected program selected from said first storing means.

5. In a system for diagnosing an automotive engine which is mounted on a motor vehicle and controlled by an electronic control system, the diagnosing system having a diagnosis device powered by turning on a power switch, a cartridge detachably connected to the diagnosis device and a communication control section provided with a CPU and a memory, connecting means for transmitting signals between the electronic control system and the diagnosis device, a keyboard provided in said diagnosis device for inputting a keyboard signal, and said communication control section being responsive to said keyboard signal for monitoring operating condition of the engine, the improvement in the communication control section comprising:

first select means responsive solely to turning on the power switch for selecting one of data formats stored in the memory representing a plurality of transmitting patterns for transmitting data between the electronic control system and the diagnosis device;

second select means responsive solely to turning on the power switch for selecting one of signaling speeds representing a plurality of transmitting speeds for transmitting data between the electronic control system and the diagnosis device;

demand means for sending an answer demand signal representing one of said data formats and signaling speeds to the electronic control system; and wherein said electronic control system has its own data format and signaling speed dependent on its type of electronic control system for the engine, and said electronic control system is arranged to provide an answer signal when said answer demand signal applied thereto corresponds to said own data format and signaling speed; and said diagnosing system comprises means responsive to said answer signal for performing a diagnosis dependent on a selected data format and signaling speed.

* * * * *